United States Patent [19]

Kurematsu

[11] Patent Number: 5,473,453
[45] Date of Patent: Dec. 5, 1995

[54] LIQUID CRYSTAL DISPLAY WITH OPAQUE FILM FORMED BY EXPOSURE THROUGH MICROLENS

[75] Inventor: Katsumi Kurematsu, Kawasaki, Japan

[73] Assignee: Canon Kabushiki Kaisha, Tokyo, Japan

[21] Appl. No.: 59,290

[22] Filed: May 11, 1993

[30] Foreign Application Priority Data

May 11, 1992 [JP] Japan .................. 4-143716

[51] Int. Cl.$^6$ ................................. G02F 1/1335
[52] U.S. Cl. ................. 359/67; 359/40; 359/900; 359/59; 359/62
[58] Field of Search .................. 359/40, 41, 49, 359/42, 62, 67, 900, 59

[56] References Cited

U.S. PATENT DOCUMENTS

| | | | |
|---|---|---|---|
| 3,744,878 | 7/1973 | Kiemle et al. | 359/40 |
| 4,790,632 | 12/1988 | Miyakawa et al. | 359/40 |
| 4,952,026 | 8/1990 | Bellman et al. | 350/100 |
| 4,981,340 | 1/1991 | Kurematsu et al. | 350/333 |
| 5,227,900 | 7/1993 | Inaba et al. | 359/56 |

FOREIGN PATENT DOCUMENTS

| | | |
|---|---|---|
| 309948 | 4/1989 | European Pat. Off. |
| 157215 | 9/1982 | Japan. |
| 26213 | 2/1985 | Japan. |
| 1816 | 1/1990 | Japan. |
| 129268 | 4/1992 | Japan. |

Primary Examiner—William L. Sikes
Assistant Examiner—Kenneth Parker
Attorney, Agent, or Firm—Fitzpatrick, Cella, Harper & Scinto

[57] ABSTRACT

A photomask (5) of a liquid crystal display panel is formed by photolithographic exposure of a photosensitive resin layer through micro-lenses (3), and the apertures thereof are in complete alignment with condensed light through the micro-lenses, so that unnecessary light, such as strayed light, can be effectively masked. The liquid crystal display panel thus formed is provided with an increased effective aperture rate and suitable for a clearer image display.

1 Claim, 3 Drawing Sheets

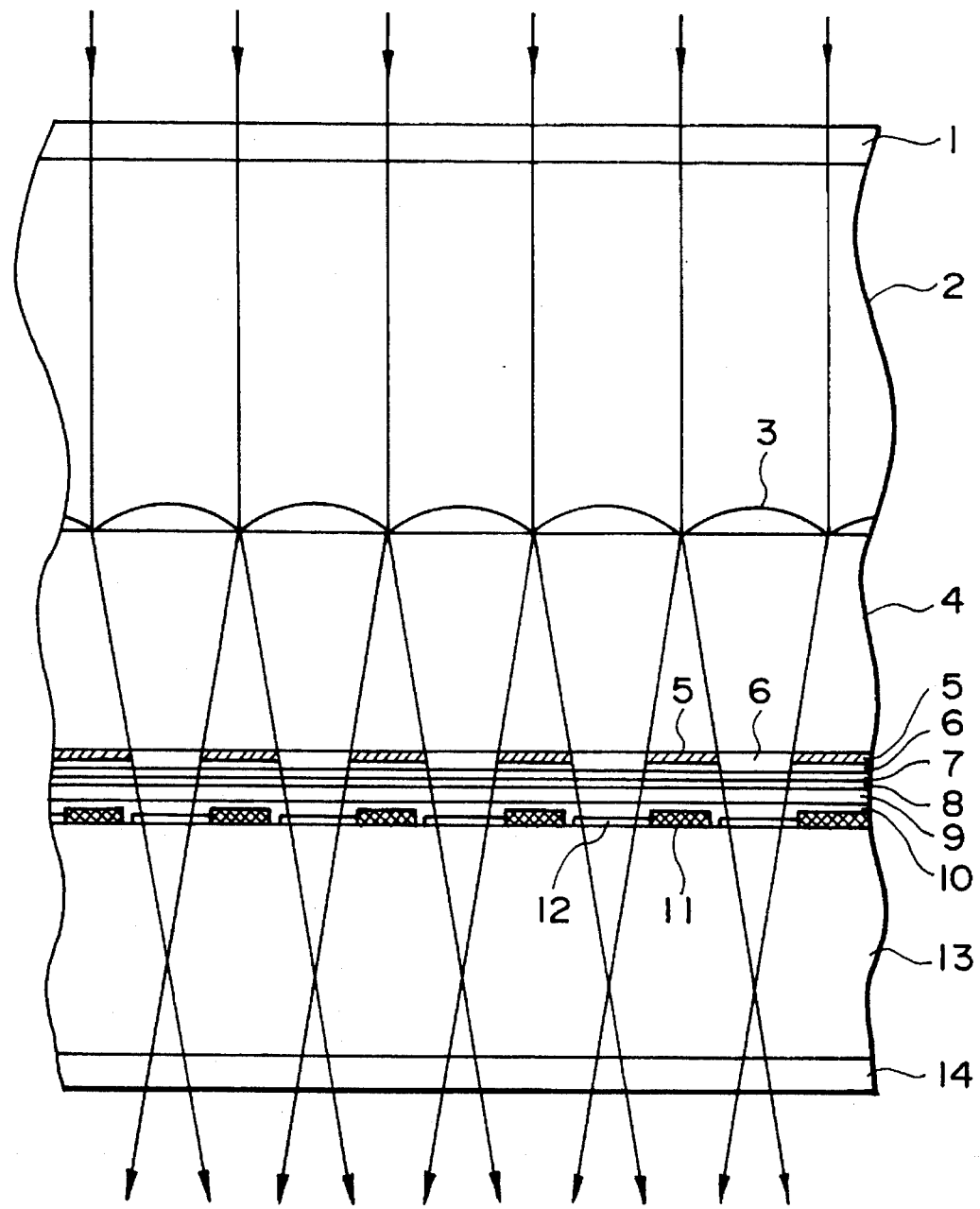
F I G. 1

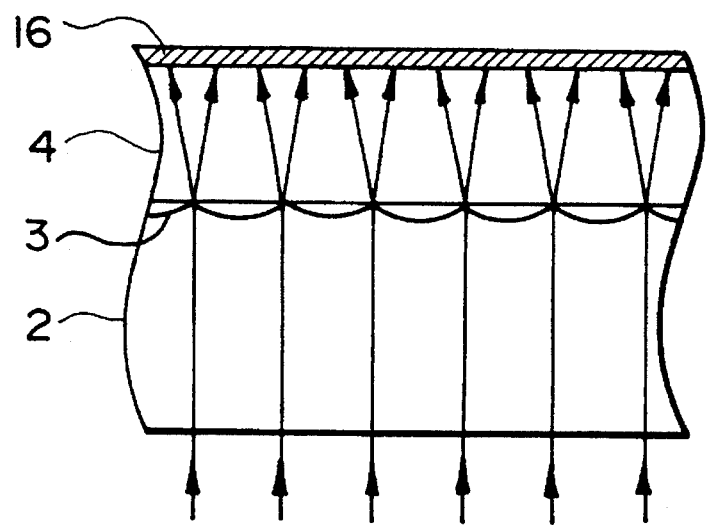
F I G. 3A
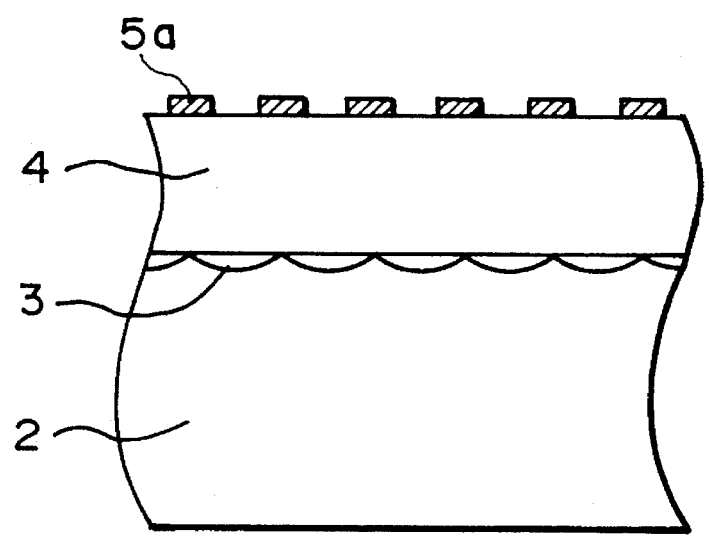
F I G. 3B

LIQUID CRYSTAL DISPLAY WITH OPAQUE FILM FORMED BY EXPOSURE THROUGH MICROLENS

FIELD OF THE INVENTION AND RELATED ART

The present invention relates to a liquid crystal display panel, particularly a liquid crystal display panel having an increased effective aperture rate by using micro-lenses, suitable for a liquid crystal display, a liquid crystal projector, etc.

Liquid crystal display panels using micro-lenses have been disclosed in, e.g., Japanese Laid-Open Patent Application (JP-A) 57-157215, JP-A 60-26213 and JP-A 2-1816. In each of the liquid crystal display panels, a glass substrate having micro-lenses formed thereon is applied to a liquid crystal display panel or micro-lenses are directly formed on a liquid crystal display panel.

In the conventional display panels, because of their production processes, an alignment between a photo-mask or light-interrupting mask for masking the region except for the effective pixel region and micro-lenses is required, and therefore a mask aperture designing including a tolerance for compensating for an alignment error is required so that incomplete masking of unnecessary light cannot be avoided.

SUMMARY OF THE INVENTION

In view of the above-mentioned problems of the prior art, an object of the present invention is to perform effective masking of unnecessary light.

According to the present invention, there is provided a process for producing a matrix-type liquid crystal display panel having a matrix of liquid crystal panels and an array of micro-lenses each corresponding to one or a plurality of the liquid crystal pixels, wherein a photomask is formed on the panel by photolithographic exposure through the micro-lenses.

According to another aspect of the present invention, there is provided a liquid crystal display panel, comprising: a matrix of liquid crystal pixels and an array of micro-lenses each corresponding to one or a plurality of the liquid crystal pixels, the display panel further comprising a photomask for masking a region except for the liquid crystal pixels formed by photolithographic exposure through the micro-lenses.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a partial sectional view for illustrating an embodiment of a liquid crystal display panel according to the invention.

FIGS. 3A and 3B are sectional views for illustrating another embodiment of the process for producing a photomask according to the invention.

DESCRIPTION OF THE PREFERRED EMBODIMENTS

In the process according to the present invention, photolithographic exposure for providing a photomask is performed through micro-lenses, so that self-alignment or automatic alignment between the photomask and the microlenses is effected, whereby condensed light flux obtained through the microlenses and the apertures of the photomask are completely aligned and the masking or interruption of unnecessary light such as strayed light is performed effectively and in a very good manner.

In the present invention, the photomask may for example be composed from a positive-type photosensitive dyed or dyeable resin or a positive-type photosensitive resin containing a pigment dispersed therein. For example, in the case where a positive-type photosensitive dyed resin, such as a novolak resin-type photoresist, the photoresist film after photolithographic exposure may be dyed, e.g., with an anthraquinone-based black dye.

The micro-lenses used in the present invention may be of any type inclusive of a graded index-type (i.e., refractive index distribution-type) or resinous lenses comprising convexities.

Hereinbelow, the present invention will be described based on some embodiments.

First embodiment

Figure 2A:
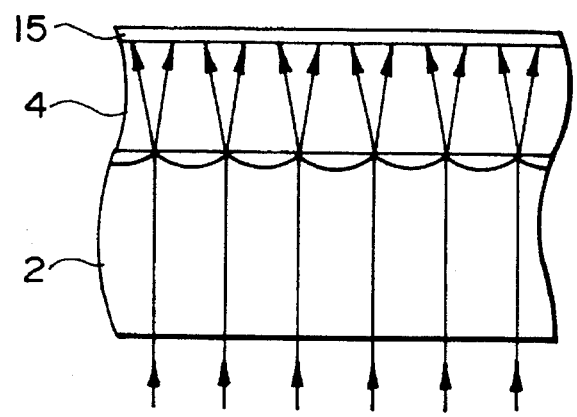
FIGS. 2A–2C are sectional views for illustrating an embodiment of the process for producing a photomask according to the invention.
Figure 2B:
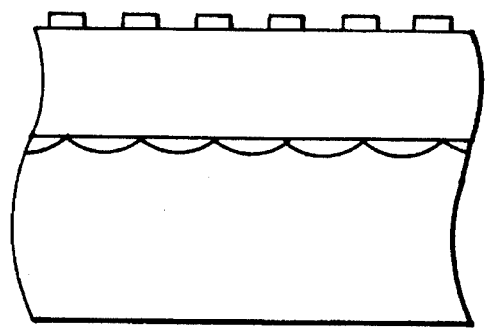
Figure 2C:
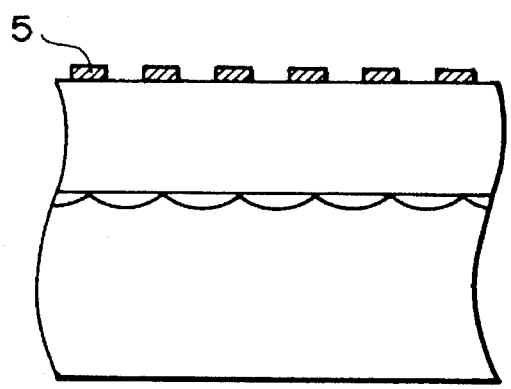

FIG. 1 is a partial sectional view of a liquid crystal display panel produced by this embodiment, and FIGS. 2A–2C are sectional views for illustrating a process for producing the photomask used therein. Referring to the figures, the liquid crystal display panel includes a counter glass substrate 4 on which a micro-lens glass substrate 2 is applied, a TFT glass substrate 13 having thin film transistors formed thereon, and a liquid crystal 9 disposed between the substrates 4 and 13. On the outer sides of the substrates are applied a pair of polarizers 1 and 14.

The production process is described below.

1) A glass substrate 4 and a glass substrate provided with graded index-type micro-lenses 3 are applied to each other, e.g., by hot pressing or using a heat-resistant adhesive.

2) The glass substrate 4 is coated by application with a positive-type photosensitive dyeable resin layer 15, which is then exposed to light through the micro-lenses 3 in a pattern corresponding to the condensation effected by the micro-lenses (as shown in FIG. 2A).

3) The exposed resin layer 15 is then developed to leave a pattern as shown in FIG. 2B by removing the parts exposed to the condensed light.

4) The resin pattern thus formed is dyed to form a photomask (pattern) 5 (FIG. 2C).

5) The photomask (pattern) 5 is then coated with a top-coat layer 6 of e.g., an inorganic oxide, such as silica, or a resin, such as epoxy resin, acrylic resin or polyimide (FIG. 1).

6) A counter electrode 7 of, e.g., ITO (indium tin oxide) is formed thereon, e.g., by sputtering.

7) An alignment film 8 is formed thereon, if necessary, followed by rubbing.

8) The counter substrate 4 thus formed is combined with a TFT glass substrate 13 provided with TFTs 11, pixel electrodes 12, data electrodes, scanning electrodes and an alignment film 10 to form a cell while alignment is effected so that the photomask 5 is aligned to mask the TFTs 11.

9) The cell is filled with a liquid crystal 9 and sealed up, and then polarizers 11 and 14 are applied on the outer sides.

In the liquid crystal display panel thus produced, the micro-lenses and the photomask are self-aligned so that light fluxes condensed by micro-lenses 3 as indicated by pairs of arrows in FIG. 1 are completely aligned with the apertures of the photomask 6. As a result, the interruption or masking of unnecessary light such as strayed light can be performed effectively and in a satisfactory manner.

In the above-embodiment, the micro-lens substrate 2 is applied onto the counter glass substrate 4. It is however also possible to apply the method of the above embodiment to production of a monolithic-type substrate wherein micro-lenses are directly formed on a counter glass substrate.

Further, the micro-lenses may be formed as a two-dimensional array of dot-type lenses or an array of cylindrical lenses.

Second embodiment

FIGS. 3A and 3B illustrate another embodiment process for production of a photo-mask to be included in a liquid crystal display panel having an entire structure identical to the one shown in FIG. 1. The production process is described below.

1) A glass substrate 2 provided with graded index-type micro-lenses 3 and a glass substrate 4 are applied to each other, e.g., by hot-pressing or with a heat-resistant adhesive.

2) The glass substrate 4 is coated by application with a positive-type photosensitive resin layer 16 containing a pigment therein, and the photosensitive resin layer 16 is then exposed to light through the micro-lenses 3 in a pattern corresponding to the condensation effected by the micro-lenses (as shown in FIG. 3A).

3) The exposed resin layer 16 is then developed to leave a photomask pattern 5a as shown in FIG. 3B by removing the parts exposed to the condensed light.

4) The photomask (pattern) 5a is then coated with a top-coat layer 6 of e.g., an inorganic oxide, such as silica, or a resin, such as epoxy resin, acrylic resin or polyimide (FIG. 1).

5) A counter electrode 7 of, e.g., ITO (indium tin oxide) is formed thereon, e.g., by sputtering.

6) An alignment film 8 is formed thereon, if necessary, followed by rubbing.

7) The counter substrate 4 thus formed is combined with a TFT glass substrate 13 provided with TFTs 11, pixel electrodes 12, data electrodes, scanning electrodes and an alignment film 10 to form a cell while alignment is effected so that the photomask 5 is aligned to mask the TFTs 11.

8) The cell is filled with a liquid crystal 9 and sealed up, and then polarizers 11 and 14 are applied on the outer sides.

In this way, a liquid crystal display panel having a structure as shown in FIG. 1 having identical effects is produced through a production process including one step less than those involved in the first embodiment.

As described above, according to the present invention, photolithographic exposure for providing a photomask is performed through micro-lenses, so that the photomask and the micro-lenses are self-aligned, whereby condensed light flux and the aperture of the photomask are completely aligned and the masking of unnecessary light is performed effectively and in a satisfactory manner.

Further, the resultant liquid crystal display panel thus produced is caused to have an increased effective aperture rate, thus providing a clear image display.

What is claimed is:

1. A liquid crystal display panel, comprising:

a first glass plate having a first surface provided with an array of micro-lenses and a second flat surface provided thereon with a patterned layer of photomasks, which has been formed by forming a photosensitive resin layer on the second flat surface and exposing the photosensitive layer to light incident from the first surface side, thereby removing the portions of the photosensitive layer having received light focused through the micro-lenses to form light-transmitting portions while leaving the remaining portions as the photomasks, a second glass plate oppositely disposed with a prescribed spacing from the first glass plate and provided with thin film transistors oriented opposite to and in alignment with the photomasks on the first glass plate; and a liquid crystal disposed between the first and second substrates.

* * * * *